United States Patent [19]
Kirk, Jr.

[11] 4,430,585
[45] Feb. 7, 1984

[54] TRISTATE TRANSISTOR LOGIC CIRCUIT WITH REDUCED POWER DISSIPATION

[75] Inventor: Edward W. Kirk, Jr., Lower Macungie Township, Lehigh County, Pa.

[73] Assignee: Bell Telephone Laboratories, Incorporated, Murray Hill, N.J.

[21] Appl. No.: 335,624

[22] Filed: Dec. 30, 1981

[51] Int. Cl.³ .................. H03K 19/088; H03K 17/62
[52] U.S. Cl. ..................................... 307/473; 307/456
[58] Field of Search ............... 307/454, 456, 457, 458, 307/473, 253, 254

[56] References Cited

U.S. PATENT DOCUMENTS

| | | | |
|---|---|---|---|
| 3,892,983 | 7/1975 | Okada et al. | 307/254 |
| 4,194,132 | 3/1980 | Mrazek | 307/209 |
| 4,287,433 | 9/1981 | Goodspeed | 307/473 |
| 4,339,675 | 7/1982 | Ramsey | 307/456 X |

*Primary Examiner*—Larry N. Anagnos
*Assistant Examiner*—David R. Hudspeth
*Attorney, Agent, or Firm*—Arthur J. Torsiglieri

[57] ABSTRACT

A power-down network is included in a tristate TTL circuit to reduce power dissipation in the high impedance third state while permitting high switching speeds during bistate operation of the circuit. The power-down circuit includes a power-down transistor connected in series between the collector resistor and collector of the phase splitter transistor. The base of the phase splitter transistor is connected through a diode to the disabling gate. A first resistor having a significantly higher value than the collector resistor is connected between the base of the power-down transistor and the $V_{CC}$ terminal. When the circuit is in the high impedance state, the power-down transistor is turned off to interrupt current flow through the collector resistor, and a relatively high impedance current path through the first resistor to the disabling gate is substitute for an otherwise relatively low impedance current path through the collector resistor.

5 Claims, 2 Drawing Figures

TRISTATE TRANSISTOR LOGIC CIRCUIT WITH REDUCED POWER DISSIPATION

BACKGROUND OF THE INVENTION

This invention relates to tristate transistor-transistor logic (TTL) circuits and more particularly to reducing power dissipation in such circuits when the circuits are in the high impedance third state.

Tristate TTL circuits, which can assume a high impedance third state as well as the binary "1" and "0" states, are known in the art. Such circuits are most commonly used in applications in which a plurality of circuits are coupled to a common bus, and only one of the circuits provides data (a binary "1" or "0") to the bus at a time while the other circuits are in the high impedance third state.

A conventional tristate TTL circuit is shown in FIG. 1. The circuit 100 includes a logic gate 101 having a data input terminal 101 for receiving a data signal, an output terminal 102, a first power supply terminal 104 for receiving a $V_{CC}$ supply voltage (typically 5 V) and a second power supply terminal 105 for receiving a second power supply voltage, which in this case is ground. Connected between the output terminal and the $V_{CC}$ supply terminal is a "pullup" network consisting of transistors T4 and T5 connected as a modified Darlington pair, a resistor R6 connected between the $V_{CC}$ supply terminal and the common collectors of T4 and T5, a resistor R5 and a diode D3 connected in series between the emitter of T4 and the output terminal. When T4 and T5 are driven to their conducting states, the pullup network is activated to "source" current from the $V_{CC}$ supply terminal to the output terminal. Connected between the output terminal and the ground terminal is a "pulldown" network consisting of a transistor T1. When T1 is driven to its conducting state, the pulldown network is activated to "sink" load current from the output terminal to the ground terminal. The pullup and pulldown networks are selectively activated by a phase splitter network consisting of a phase splitter transistor T2 having its base connected to the data input terminal and its collector and emitter respectively connected to the bases of T4 and T1, a collector resistor R1 connected between the collectors of T2 and the $V_{CC}$ supply terminal, and a conventional squaring network, consisting of a transistor T3 and resistors R3 and R4, connected between the emitter of T2 and the ground terminal. A resistor R2 is connected between the base of T2 and the $V_{CC}$ supply terminal.

When the data signal received by the base of T2 is at a low level such that T2 is in the nonconducting state, the base of T4 is pulled to approximately $V_{CC}$ through R1 causing T4 and T5 to go to the conducting state, and base current to T1 is removed causing T1 to go to the nonconducting state. Under these conditions, the pullup network is active, and the pulldown network is inactive causing the output terminal to go to a logic "1" voltage level of greater than 2.5 V (assuming positive logic).

When the data signal is a high level such that T2 is driven to the conducting state by base current provided through R2, the base of T4 is pulled to a low voltage causing T4 and T5 to go to the nonconducting state, and T1 is driven to the conducting state by base current provided by T2. Under these conditions, the pullup network is inactive, and the pulldown network is active causing the output terminal to go to a logic "0" level of less than 0.4 V (assuming positive logic).

The circuit of FIG. 1 also includes a disabling network 106 consisting of a control input terminal 103 and a transistor T11 having its base connected to receive a control signal from the control input terminal, its collector connected to the cathodes of coupling diodes D1 and D2 and its emitter connected to the ground terminal. The anodes of D1 and D2 are connected to the base and collector of T2, respectively.

When the control signal is a low level such that T11 is in the nonconducting state, the disabling network is inactive and has virtually no effect on the bistate operation of the gate described above. However, when the control signal is at a high level such that T11 is driven to the conducting state, the disabling circuit is active to sink current from the bases of T2 and T4 causing T1, T2, T4 and T5 to all go to the nonconducting state. Under these conditions the pullup and pulldown networks are both inactive, regardless of the data signal, and the output terminal goes to a third state of being isolated from the $V_{CC}$ and ground terminals by the nonconducting-state impedances of T5 and T1, respectively.

The diodes D1 and D2 coupling the gate to the disabling network permit only one-way current flow from the gate to the disabling network. Therefore, more than one gate may be coupled through similar diodes to the disabling network.

In order to achieve higher switching speeds for the circuit of FIG. 1, typically transistors T1, T2, and T3 of the gate and T11 of the disabling network are Schottky-clamped, and diodes D1, D2 and D3 of the gate are Schottky diodes. It is well known that a Schottky-clamped transistor has a shorter turn-off time than a conventional transistor, and a Schottky diode has a shorter charge storage time than a conventional diode. In addition, the resistors R1, R2, R5 and R6 of the gate have relatively low values to provide high internal drive currents for the transistors of the gate. For example, typical values of R1, R2, R5 and R6 in the circuit of FIG. 1 are 900Ω, 2.8 KΩ, 400Ω and 60Ω, respectively.

One problem with the conventional tristate TTL circuit is that when the disabling network is active, a relatively low impedance current path exists between the $V_{CC}$ supply terminal and the ground terminal through R1, D2 and T11. Consequently, the circuit has a relatively high power dissipation when it is in the high impedance state. For example, the circuit of FIG. 1 typically dissipates 7.5 mW in the logic "1" state, 27.5 mW in the logic "0" state and 30 mW in the high impedance state. In the common bus application described above, all but one of the circuits coupled to a bus are in the high impedance state at any given time. Therefore, the high impedance state power dissipation of conventional tristate logic circuits can contribute substantially to the overall power dissipation of a heavily bus-oriented system, such as a data processor. It is generally desirable to minimize the power dissipation of a system in order to minimize system cost with respect to power supply, cooling and space requirements.

Another problem with the conventional tristate TTL circuit related to the problem of high power dissipation is that the disabling network must sink a relatively large current for each gate it serves. Consequently, a typical disabling network having a current sinking capability of 20 mA can serve only three gates of the type shown in FIG. 1. Consequently, a system using many tristate logic gates may require an excessive number of disabling networks. Where the system is wholly or partially integrated on a single chip, it is particularly important to minimize the number of disabling networks needed by the system in order to minimize chip area usage.

The high impedance state power dissipation of a tristate TTL circuit can be reduced by raising the value of the collector resistor R1 to increase the impedance of the current path to the disabling network. However, raising the value of R1 has the disadvantage of also reducing the current drive to the pullup and pulldown networks during bistate operation and, therefore, degrades the switching speed of the circuit in both the logic "1" to logic "0" (1-0) and the logic "0" to logic "1" (0-1) transitions.

A prior art circuit technique for reducing the high impedance state power dissipation of a tristate TTL circuit which causes less degradation in the switching speed of the circuit is to raise the value of the collector resistor and to add a current boosting transistor connected in parallel with the phase splitter transistor. The current boosting transistor has its base and emitter connected to the base and emitter of the phase splitter transistor T2, respectively. The collector of the current boosting transistor is connected either directly to the $V_{CC}$ supply terminal or indirectly through a relatively low valued resistor. Thus, the high impedance power dissipation is reduced by the higher value of the collector resistor which increases the impedance of the current path to the disabling network, and additional current drive to the pulldown network is provided by the current boosting transistor, which is not coupled to the disablings network. Therefore, this prior art technique reduces the high impedance state power dissipation while substantially preserving the switching speed of the 1-0 transition, as compared to that of the conventional TTL circuit.

However, this technique has the disadvantage in that the current drive to the pullup network is not boosted, and the circuit suffers from a degradation in the switching speed of the 0-1 transition owing to the relatively high value of the collector resistor.

Therefore, a need exists for a tristate TTL circuit having lower power dissipation in the high impedance state than the prior art while substantially preserving the switching speeds of both the 0-1 and the 1-0 transitions as compared to those of the conventional tristate TTL circuit.

SUMMARY OF THE INVENTION

The disadvantages of the prior art have been substantially removed by the present invention which is a tristate logic circuit which includes the basic elements of the conventional TTL circuit discussed as the prior art but avoids its shortcomings by including power-down means coupled in series with the phase emitter network between the power supply terminals for interrupting current flow from the $V_{CC}$ supply terminal through the phase splitter network and for providing a relatively high impedance current path to the disabling network while the disabling network is active.

In the preferred embodiment of the present invention, the phase splitter network comprises a phase splitter transistor having its collector coupled to the pullup network and its emitter coupled to the pulldown network and its base coupled to the data input terminal and a collector resistor having one end coupled to the $V_{CC}$ supply terminal and being in series with the collector of the phase splitter transistor. The base and collector of the phase splitter transistor are also coupled to the disabling network through respective diodes, and a squaring network is coupled between the emitter of the phase splitter transistor and the second power supply terminal. A second resistor having a significantly larger value than that of the collector resistor is connected between the base of the phase splitter transistor and the first power supply terminal. The power-down means comprises a power-down transistor having its base coupled through a diode to the disabling network, its collector coupled to the other end of the collector resistor and its emitter coupled to the collector of the phase splitter transistor. The power-down means also includes a third resistor coupled between the first power supply terminal and the base of the power-down transistor and having a value significantly greater than that of the collector resistor. There is also included a fourth resistor coupled between the first power supply terminal and the pullup means and having a value significantly larger than that of the collector resistor. When the disabling network is active, the pullup and pulldown networks are inactive by the removal of the drive currents provided through R1 and T2, respectively, and the output terminal goes to the high impedance state. In addition, the power-down transistor goes to the nonconducting state to interrupt current flow through the collector resistor, and the relatively low impedance current path from the first power supply terminal to the disabling network through the collector resistor is eliminated and replaced by relatively high impedance current paths through the third and fourth resistors. Thus, the power-down means allows the use of a relatively low value of collector resistor to provide high switching speeds for both the 0-1 and the 1-0 transitions but eliminates the relatively low impedance current path through the collector resistor while the circuit is in the high impedance state to reduce power dissipation of the circuit and to permit the disabling network to serve more gates.

DETAILED DESCRIPTION

Figure 2:
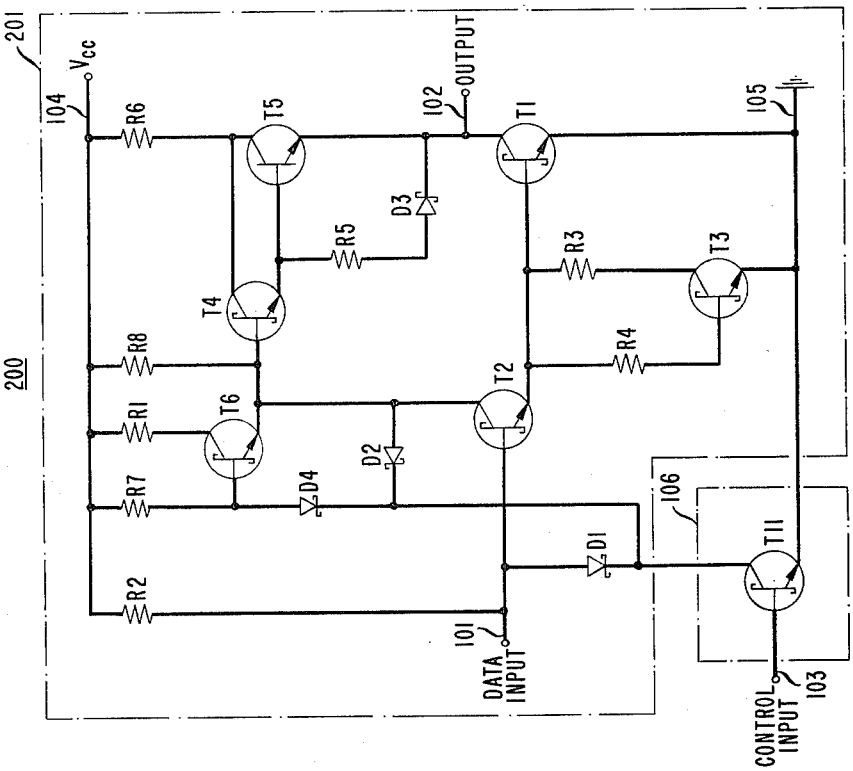
FIG. 2 is a schematic diagram of a tristate logic circuit according to the preferred embodiment of the present invention.
Figure 1:
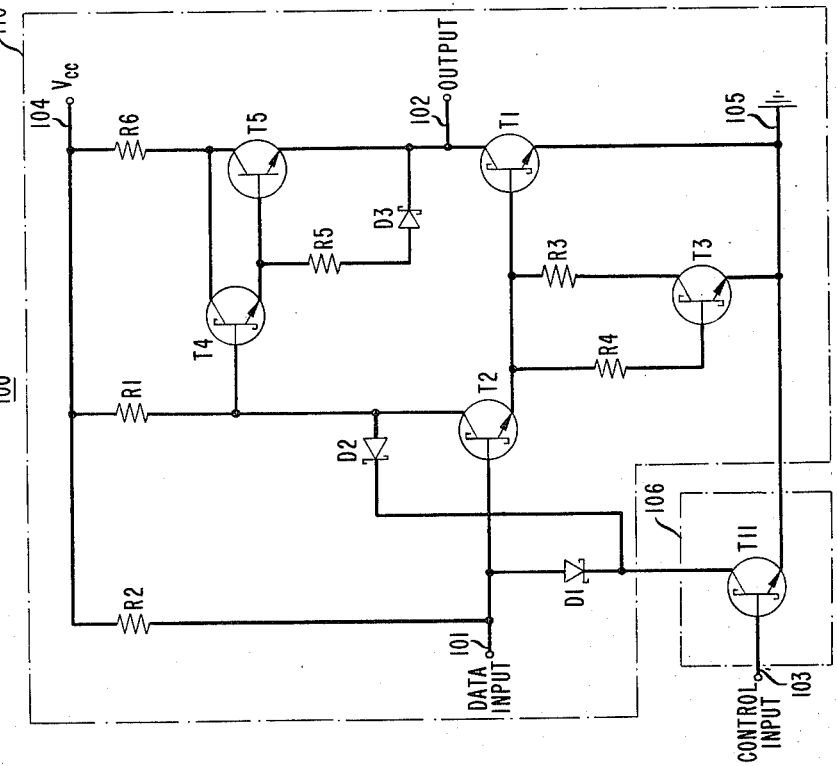
FIG. 1 is a schematic diagram of a conventional tristate TTL circuit of the kind previously discussed.

Referring now to FIG. 2, there is shown a schematic diagram of a tristate TTL circuit 200 according to the preferred embodiment of the present invention. Reference numerals and characters used in FIG. 1 are also being used in FIG. 2 to denote like components, parts and terminals. The circuit includes a logic gate 201 having a data input terminal 101 for receiving a data signal, an output terminal 102, a first terminal 104 for receiving a $V_{CC}$ power supply voltage and a second terminal 105 for receiving a second power supply voltage, which in this example is ground. Connected between the output terminal and the $V_{CC}$ supply terminal is a conventional pullup network consisting of a modified Darlington transistor pair T4 and T5, resistors R5 and R6 and a diode D3. Connected between the output terminal and the ground terminal is a conventional pulldown network consisting of a transistor T1. The pullup and pulldown networks are selectively activated by a conventional phase splitter network in response to a data signal received at the data input terminal. The phase splitter network consists of a phase splitter transistor T2, a collector resistor R1 having one end connected to the $V_{CC}$ supply terminal and being in series with the collector of T2 and a conventional squaring network, consisting of a transistor T3 and resistors R3 and R4 connected between the emitter of T2 and the ground terminal. The phase splitter transistor T2 also has its base connected to the data input terminal, its collector connected to the base of T4 and its emitter connected to the base of T1. A resistor R2 is connected between the $V_{CC}$ terminal and the base of T2.

The gate further features of a power-down network consisting of a transistor T6, having its collector connected to the other end of R1 and its emitter connected to the collector of T2 and the base of T4, and a resistor R7 connected between the $V_{CC}$ supply terminal and the base of T6. A resistor R8 is connected between the $V_{CC}$ supply terminal and the base of T4.

The circuit also includes a conventional disabling network 106 consisting of a control input terminal 103 for receiving a control signal and a transistor T11 having its base connected to the control input terminal, its collector connected to the base and collector of T2 and the base of T6 through respective diodes D1, D2 and D4, and its emitter connected to the ground terminal. Each of the diodes D1, D2 and D4 is connected to permit only one-way current flow to the disabling network.

When the control signal applied to the base of T11 is a low level such that T11 is in the nonconducting state, the disabling network is inactivated. Under these conditions, T6 is driven to its conducting state by base drive provided through R7, and the gate operates in a bistate mode in the manner described above for the conventional TTL circuit.

When the control signal is a high level such that T11 is driven to the conducting state, the disabling network is activated to sink current from the bases of T2, T6 and T4. Under these conditions, T1, T2, T4, T5 and T6 are all in the nonconducting state, and the output terminal goes to the high impedance third state.

Current flow from the $V_{CC}$ supply terminal through R1 to the collector of T2 is interrupted when T6 is in the nonconducting state. Therefore, power dissipation of the circuit in the high impedance state is largely determined by the current flow through resistors R2, R7 and R8, each of which has a value which is significantly less than that of R1. In the preferred embodiment the values of R1, R2, R7 and R8 are 900Ω, 2.8 KΩ, 5 KΩ 10 KΩ, respectively. The high impedance state power dissipation of the preferred embodiment is typically 11 mW, in contrast with 30 mW for the conventional TTL circuit. In the logic "1" and "0" states, the power dissipation of the preferred embodiment is substantially the same as that of the conventional TTL circuit of FIG. 1.

For the same values of R1, R3, R4, R5 and R6, the switching speeds of the circuit of FIG. 2 for both the 0-1 and the 1-0 transitions are substantially preserved, as compared to those of conventional TTL circuits. In the circuit of FIG. 2 the turn-on time of T6 introduces a small increase in the delay of the 1-0 transition, and the additional capacitance on the collector of T2 resulting from the connection thereto of T6 and R8 introduces a small increase in the delay of the 0-1 transition. The use of the power-down network according to the present invention also introduces an increase in the time required for the circuit to go from the high impedance state to one of the binary states, i.e., the enabling time. However, a longer enabling time is ordinarily not detrimental to system performance since the preferred mode of operating a time-shared bus is to disable one tristate circuit on the bus before enabling another one.

The resistor R8 is advantageously added to the circuit of FIG. 2 in order to ensure a proper logic "1" level at the output terminal.

The values of R7 and R8 may be increased to achieve a further reduction in the high impedance state power dissipation of the circuit. However, such increase would result in further small degradation of the switching speeds of the circuit.

In order to achieve high switching speeds for the circuit, transistors T1, T2, T3, T4, T6 and T11 are Schottky-clamped and diodes D1, D2, D3 and D4 are Schottky diodes. However, the use of Schottky-clamped transistors and Schottky diodes is not necessary to the practice of the present invention.

Owing to the reduction in the current flow per gate to the disabling network provided by the present invention, each disabling network may serve a larger number of such gates than conventional TTL gates. For example, a disabling network having a current-sinking capability of 20 mA can serve up to nine gates of the type shown in FIG. 2.

The disabling network may be an appropriate bistate TTL logic gate, such as an inverter, instead of the single transistor used in the circuit of FIG. 2.

The data signal received on the phase splitter transistor may be provided by the collector of an input transistor having multiple emitters for receiving respective input signals and a base which is connected to the $V_{CC}$ supply terminal through an appropriate resistor instead of the data input terminal and the resistor R2 used in the circuit of FIG. 2.

While this invention has been described in terms of a particular tristate Schottky-clamped TTL circuit, it will be understood by those skilled in the art that the above and other alterations and modifications may be made to the details of the circuit without departing from the spirit and scope of the invention. For example, other forms of power-down networks which respond to the activation of the disabling network by interrupting current flow through the collector resistor and providing a relatively high impedance current path to the disabling network may be substituted for the power-down network consisting of transistor T6 and resistor R7 used in the preferred embodiment, and the present invention is applicable to all forms of TTL circuits and not only to high power Schottky-clamped TTL circuits.

What is claimed is:

1. A tristate logic circuit comprising:
data input means;
an output terminal;
control input means;
first and second terminals for receiving a first and a second operating voltage, respectively;
pullup means coupled between the first terminal and the output terminal for sourcing current from the first terminal to the output terminal when activated;
pulldown means coupled between the second terminal and the output terminal for sinking current from the output terminal to the second terminal when activated;
phase splitter means coupled between the first and second terminals and being responsive to a data signal from the data input means for selectively activating the pullup means or the pulldown means;

disabling means coupled to the control input means, the phase splitter means and the second terminal and being activated by a control signal from the control input means for sinking current from the phase splitter means to the second terminal so as to inactivate both the pullup means and the pulldown means;

characterized in that there are included power-down means coupled in series with the phase splitter means and to the disabling means for interrupting current flow through the phase splitter means and for providing a relatively high impedance current path from the first terminal to the disabling means in dependence upon the disabling means being activated.

2. A tristate logic circuit as recited in claim 1 wherein the phase splitter means comprises a phase splitter transistor having a base electrode coupled to the data input means, a collector electrode coupled to the pullup means and an emitter electrode coupled to the pulldown means, a first resistance having one end coupled to the first terminal and being in series with the collector electrode of the phase splitter transistor, and means coupling the emitter electrode of the phase splitter transistor to the second terminal; the disabling means comprising a first transistor having a base electrode coupled to the control input means, a collector electrode and an emitter electrode coupled to the second terminal; and there are included first and second diodes each having an anode electrode coupled respectively to the base and collector electrodes of the phase splitter transistor and a cathode electrode coupled to the collector electrode of the first transistor; further characterized in that the power-down means comprises a second transistor having a base electrode, a collector coupled to another end of the first resistance, and an emitter electrode coupled to the collector electrode of the phase splitter transistor, a second resistor coupled between the first terminal and the base electrode of the second transistor, and a third diode having an anode electrode coupled to the base electrode of the second transistor and a cathode electrode coupled to the collector electrode of the first transistor.

3. A tristate logic circuit as recited in claim 2 wherein the pulldown means comprises a third transistor having a base electrode coupled to the emitter electrode of the phase splitter transistor, a collector electrode coupled to the output terminal and an emitter electrode coupled to the second terminal; and the pullup means comprises a fourth transistor having a base electrode, a collector electrode and an emitter electrode coupled to the output terminal, a fifth transistor having a base electrode coupled to the collector electrode of the phase splitter transistor, a collector electrode coupled to the collector electrode of the fourth transistor and an emitter electrode coupled to the base electrode of the fourth transistor; a third resistance coupled between the first terminal and the collector electrode of the fourth transistor; and a fourth resistance coupled between the first terminal and the base electrode of the fifth transistor, the fourth resistance being significantly larger than the first resistance.

4. A tristate logic circuit as recited in claim 3 wherein there are included a fifth resistance having one end coupled to the emitter electrode of the fourth transistor, and a fourth diode having an anode electrode coupled to another end of the fifth resistance and a cathode electrode coupled to the emitter electrode of the fourth transistors; and the means coupling the emitter electrode of the phase splitter transistor to the second terminal comprises a sixth transistor having a base electrode, a collector electrode and an emitter electrode coupled to the second terminal, a sixth resistance coupled between the emitter electrode of the phase splitter transistor and the base electrode of the sixth transistor and a seventh resistance coupled between the emitter electrode of the phase splitter transistor and the collector electrode of the sixth transistor.

5. A tristate logic circuit as recited in claim 4 wherein the data input means comprises a data input terminal connected to the base electrode of the phase splitter transistor and there is included an eighth resistance coupled between the first terminal and the base electrode of the phase splitter transistor, the eighth resistance being significantly larger than the first resistance.

* * * * *